United States Patent
Sakai et al.

(10) Patent No.: US 10,984,980 B2
(45) Date of Patent: Apr. 20, 2021

(54) CHARGED PARTICLE BEAM DEVICE FOR IMAGING VIAS INSIDE TRENCHES

(71) Applicant: Hitachi High-Tech Corporation, Tokyo (JP)

(72) Inventors: Kei Sakai, Tokyo (JP); Satoru Yamaguchi, Tokyo (JP); Hideki Itai, Tokyo (JP); Yasunori Takasugi, Tokyo (JP); Kumiko Shimizu, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/071,816

(22) PCT Filed: Jan. 29, 2016

(86) PCT No.: PCT/JP2016/052559
§ 371 (c)(1),
(2) Date: Jul. 20, 2018

(87) PCT Pub. No.: WO2017/130364
PCT Pub. Date: Aug. 3, 2017

(65) Prior Publication Data
US 2019/0035600 A1    Jan. 31, 2019

(51) Int. Cl.
*H01J 37/28* (2006.01)
*H01J 37/147* (2006.01)
(Continued)

(52) U.S. Cl.
CPC ............ *H01J 37/28* (2013.01); *H01J 37/147* (2013.01); *H01J 37/22* (2013.01); *H01J 37/265* (2013.01);
(Continued)

(58) Field of Classification Search
CPC .......... H01J 37/28; H01J 37/265; H01J 37/22; H01J 37/147; H01J 2237/281; H01J 2237/2803
See application file for complete search history.

(56) References Cited

U.S. PATENT DOCUMENTS

| | | | |
|---|---|---|---|
| 2006/0060781 A1* | 3/2006 | Watanabe | B82Y 10/00 250/310 |
| 2011/0170091 A1* | 7/2011 | Chang | G01N 21/9501 356/237.5 |

(Continued)

FOREIGN PATENT DOCUMENTS

| | | |
|---|---|---|
| JP | 2012-84287 A | 4/2012 |
| JP | 2014-163860 A | 9/2014 |

(Continued)

OTHER PUBLICATIONS

International Search Report (PCT/ISA/210) issued in PCT Application No. PCT/JP2016/052559 dated May 17, 2016 with English translation (three (3) pages).

(Continued)

*Primary Examiner* — Brooke Purinton
(74) *Attorney, Agent, or Firm* — Crowell & Moring LLP

(57) ABSTRACT

The objective of the present invention is to provide a charged particle beam device for setting, from an image of a trench-like groove or a pit, device conditions for finding a hole or the like provided in the trench or the pit, or measuring a hole or the like provided inside the trench or the like with high accuracy. In the present invention, a charged particle beam device comprises: a deflector for causing a charged particle beam emitted from a charged particle source to perform a scan; a detector for detecting a charged particle obtained on the basis of the scanning of the charged particle beam; and a computation processing device for generating an image on the basis of the output of the
(Continued)

detector. In the charged particle beam device, the computation processing device specifies, from within the generated image, a relatively dark region with respect to other parts thereof, and controls the deflector in such a manner that the charged particle beam selectively scans a sample position corresponding to the dark region.

8 Claims, 10 Drawing Sheets

(51) Int. Cl.
*H01J 37/22* (2006.01)
*H01J 37/26* (2006.01)
(52) U.S. Cl.
CPC . *H01J 2237/281* (2013.01); *H01J 2237/2803* (2013.01)

(56) References Cited

U.S. PATENT DOCUMENTS

| | | | | |
|---|---|---|---|---|
| 2012/0274757 A1* | 11/2012 | Bai | ................... | H01J 37/28 348/79 |
| 2014/0092231 A1* | 4/2014 | Nakahira | ............... | H01J 37/244 348/80 |
| 2015/0002651 A1* | 1/2015 | Shimizu | ................ | H01J 37/222 348/80 |
| 2015/0377921 A1* | 12/2015 | Ukraintsev | ............ | G01Q 30/02 324/750.19 |
| 2016/0240348 A1 | 8/2016 | Yokosuka et al. | | |
| 2016/0276127 A1* | 9/2016 | Gronau | ................. | H01J 37/222 |
| 2016/0322194 A1* | 11/2016 | Kooijman | ............... | H01J 37/28 |
| 2017/0194125 A1* | 7/2017 | Kris | ....................... | H01J 37/28 |

FOREIGN PATENT DOCUMENTS

WO   WO 2015/045498 A1   4/2015
WO   WO 2015/182224 A1   12/2015

OTHER PUBLICATIONS

Japanese-language Written Opinion (PCT/ISA/237) issued in PCT Application No. PCT/JP2016/052559 dated May 17, 2016 (four (4) pages).

* cited by examiner

[FIG. 1A]     Top view
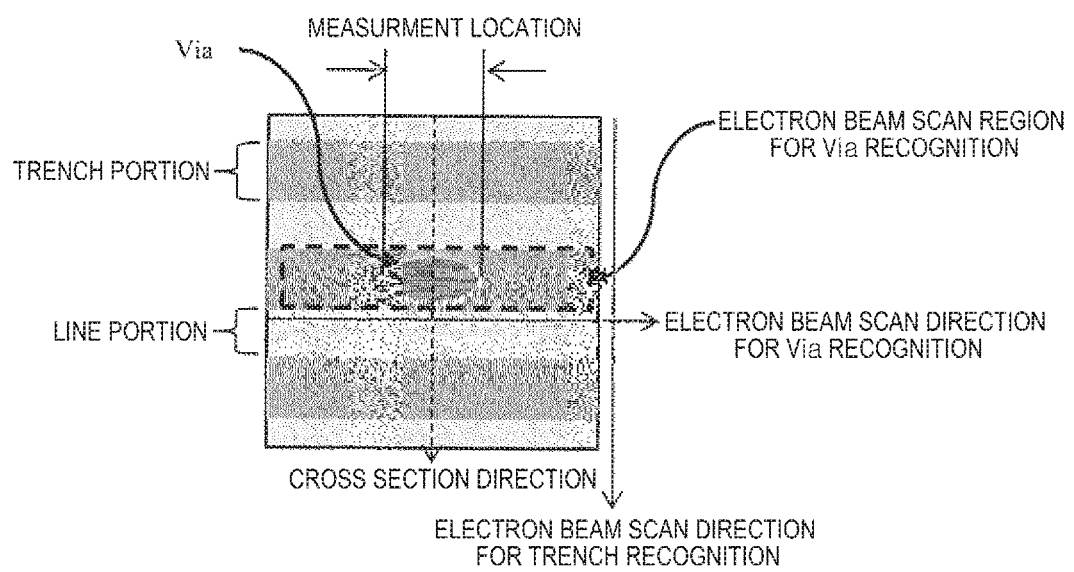
[FIG. 1B]     Cross Section
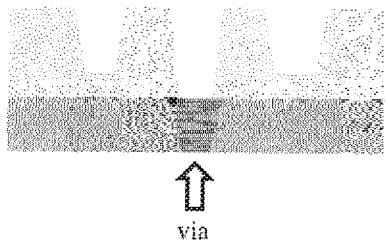

[FIG. 2]
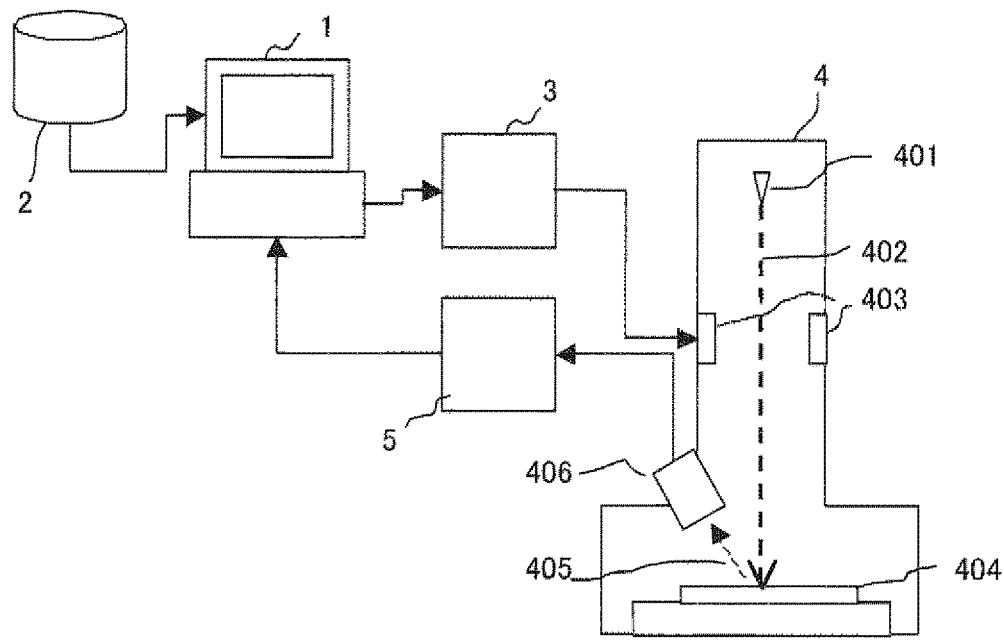
[FIG. 3]
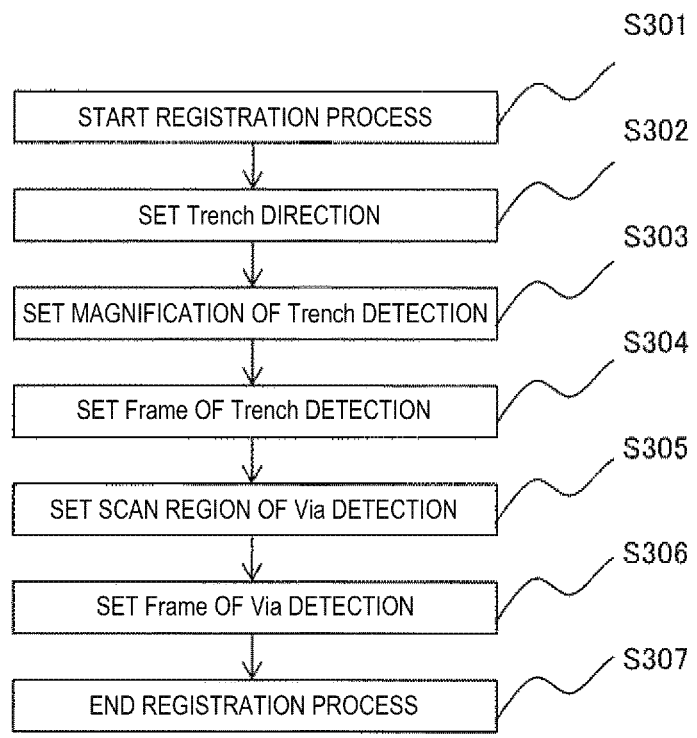

[FIG. 4A]   MODEL DIAGRAM OF SEM IMAGE
FOR EVERY ADDITION OF Frame
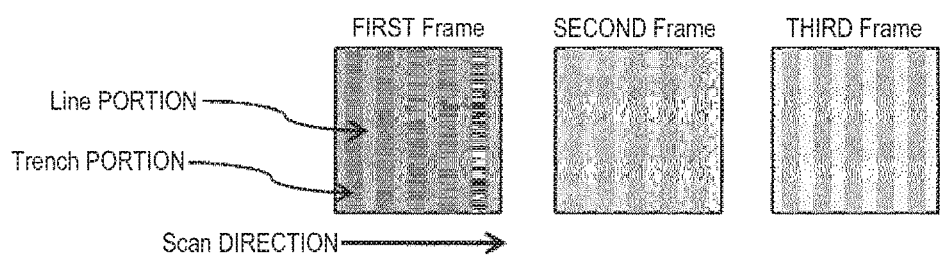
[FIG. 4B]   SIGNAL INTENSITY SPECTRUM OF SEM IMAGE
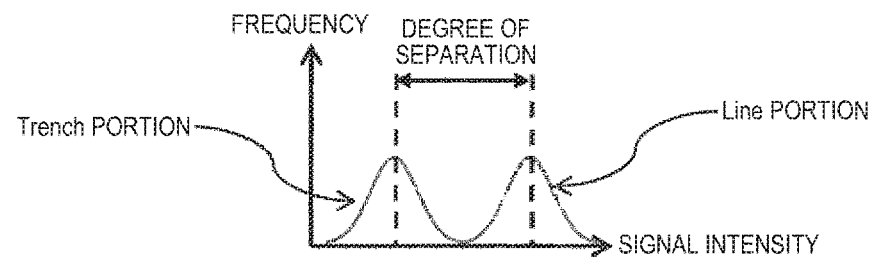
[FIG. 4C]   DEGREE OF SEPARATION WITH
RESPECT TO NUMBER OF FRAME
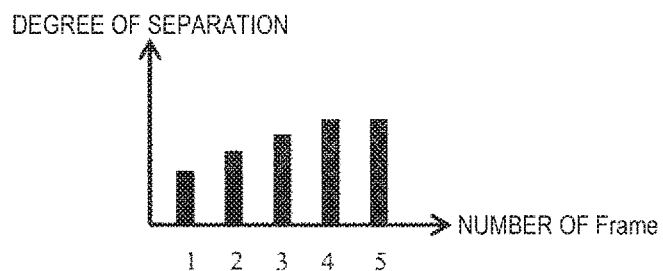

[FIG. 5A]  SCAN REGION OF Via REGION
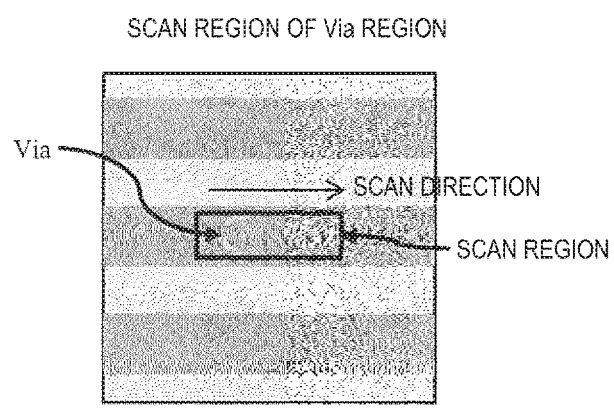
[FIG. 5B]  PROJECTED WAVEFORM OF SIGNAL INTENSITY OF Via REGION FOR EVERY NUMBER OF Frame
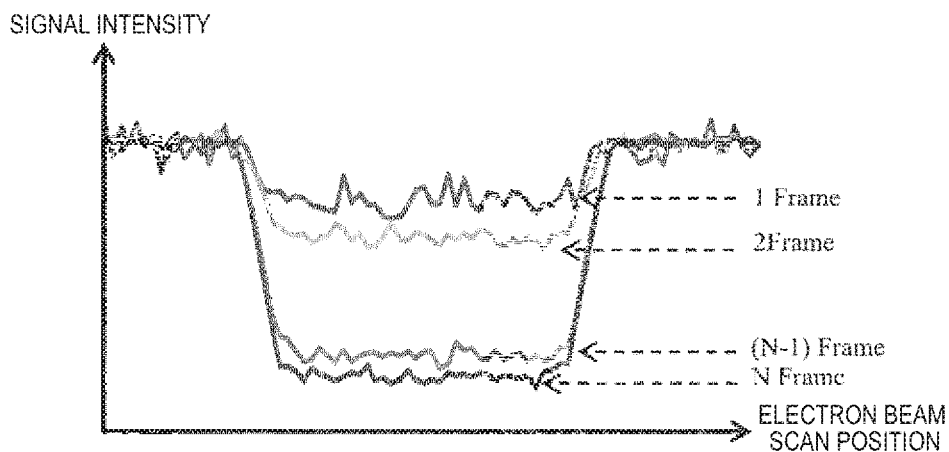
[FIG. 5C]  MAXIMUM VALUE-MINIMUM VALUE OF SIGNAL INTENSITY OF Via REGION FOR EVERY NUMBER OF Frame
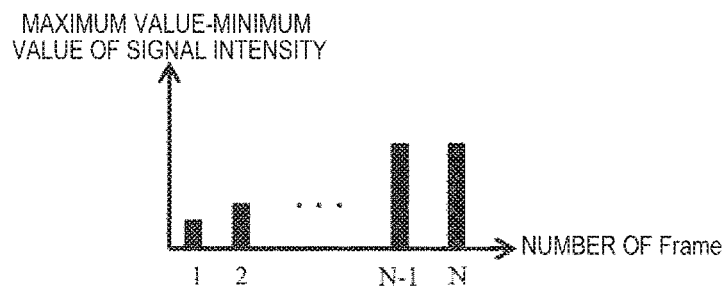

[FIG. 6]
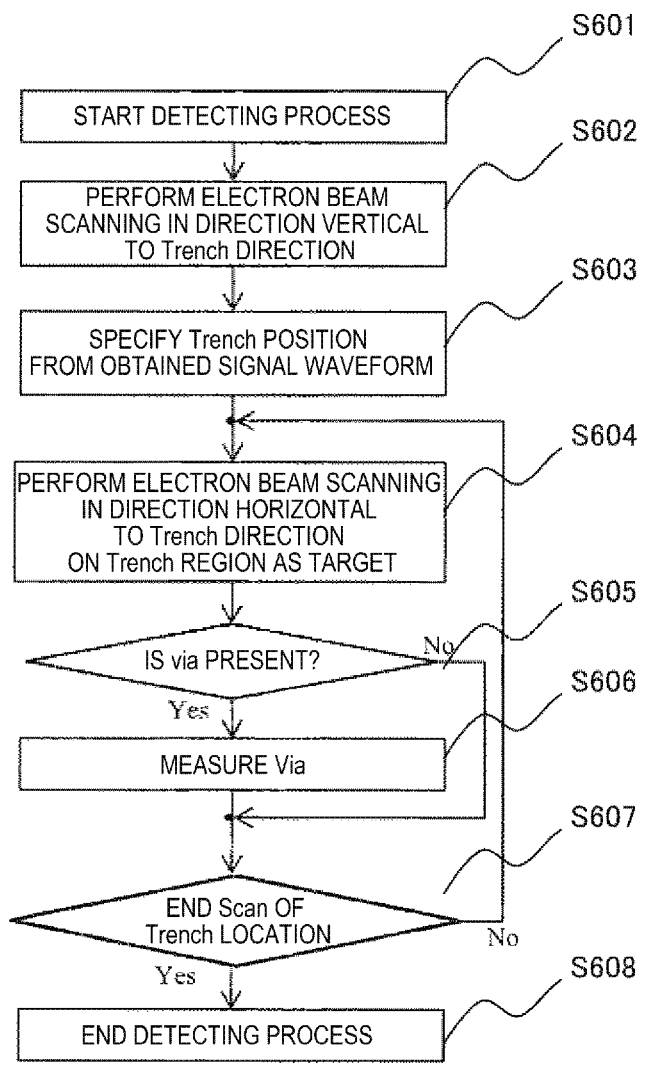

[FIG. 7]
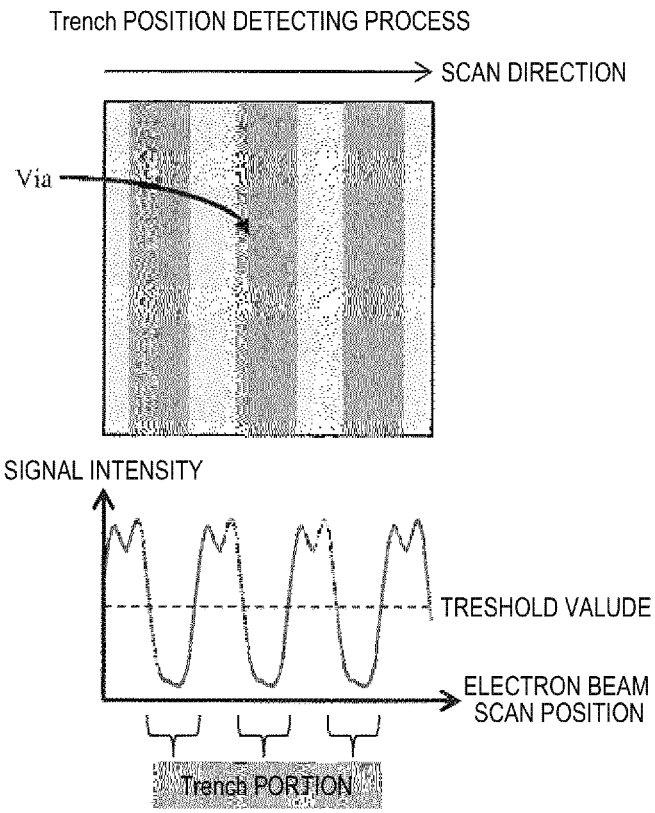
[FIG. 8]
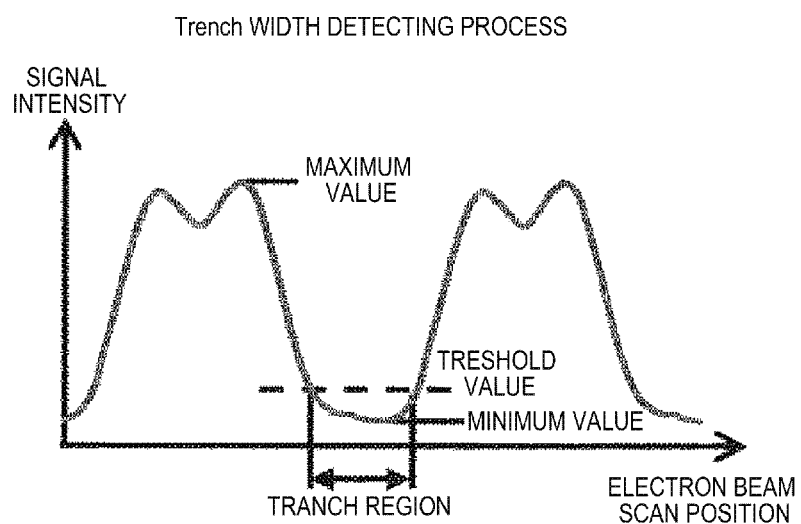

[FIG. 9]
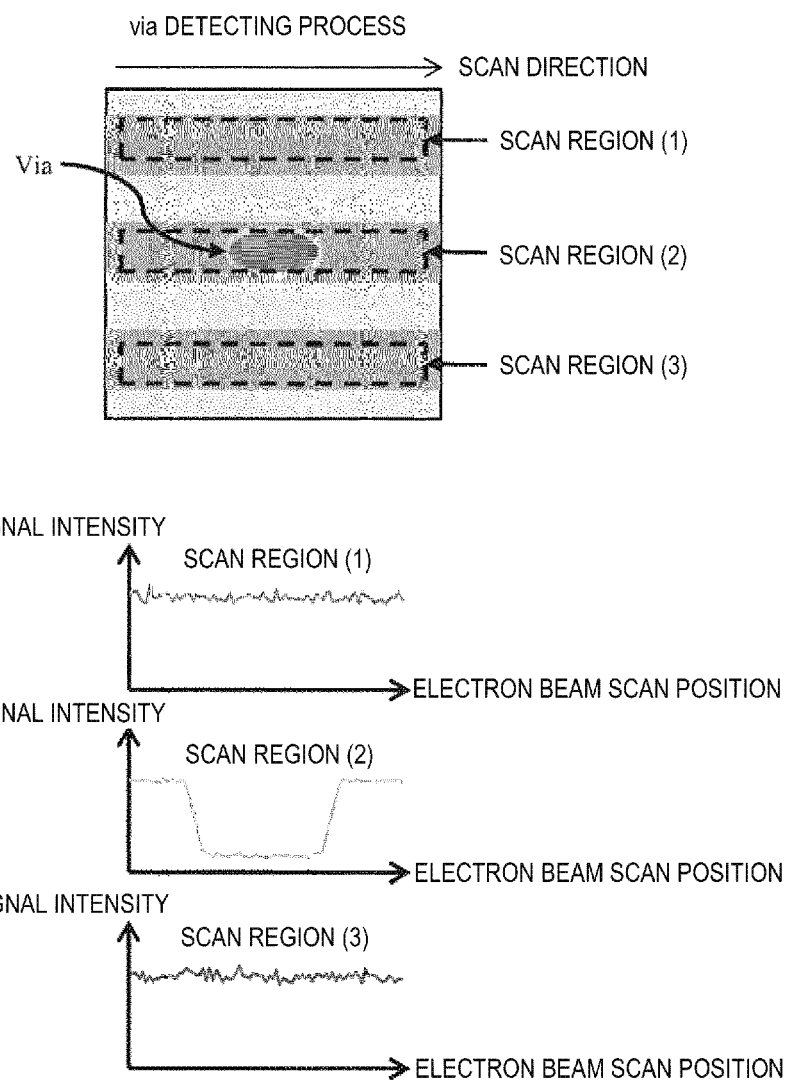

[FIG. 10]
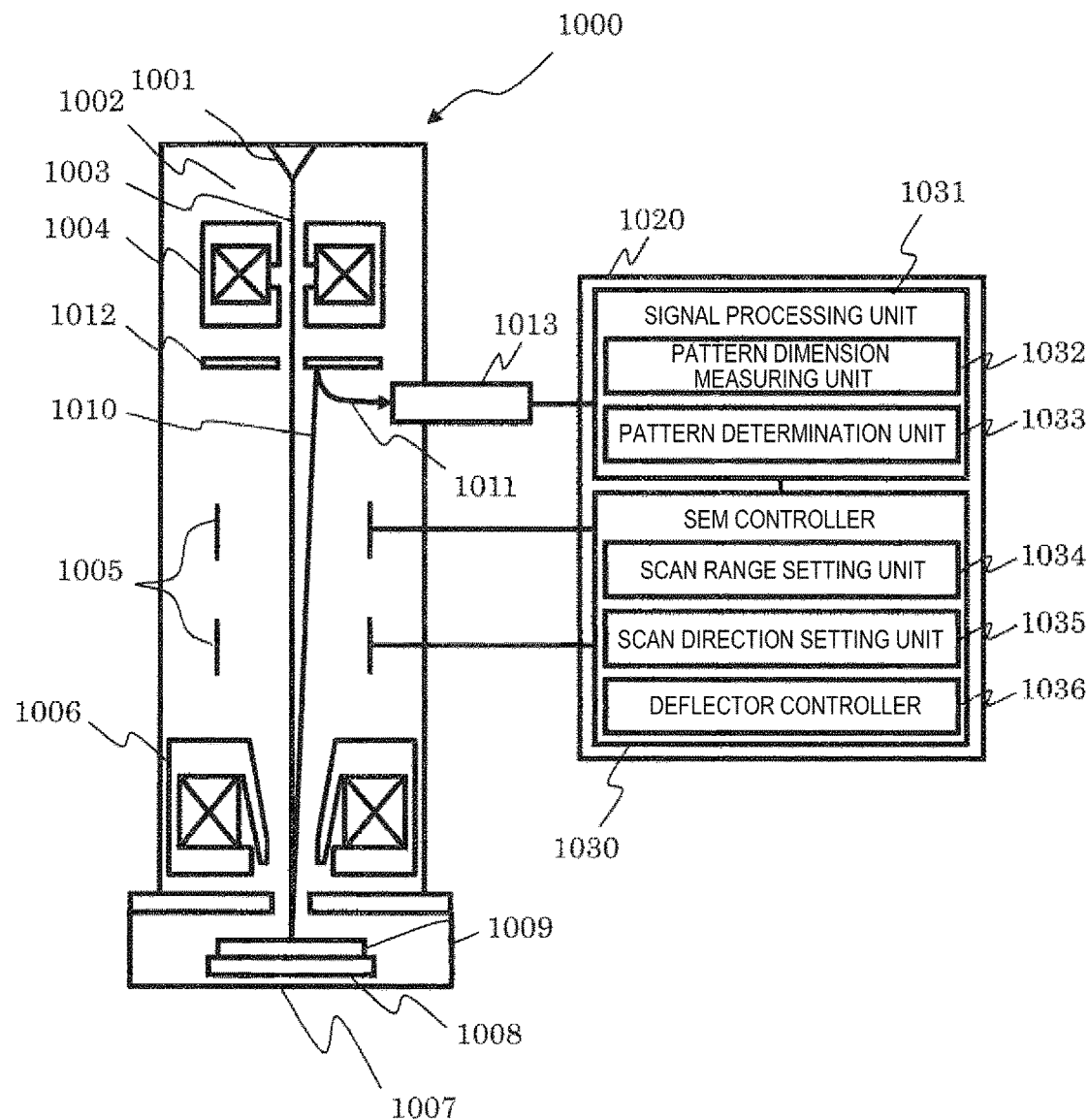

[FIG. 11]
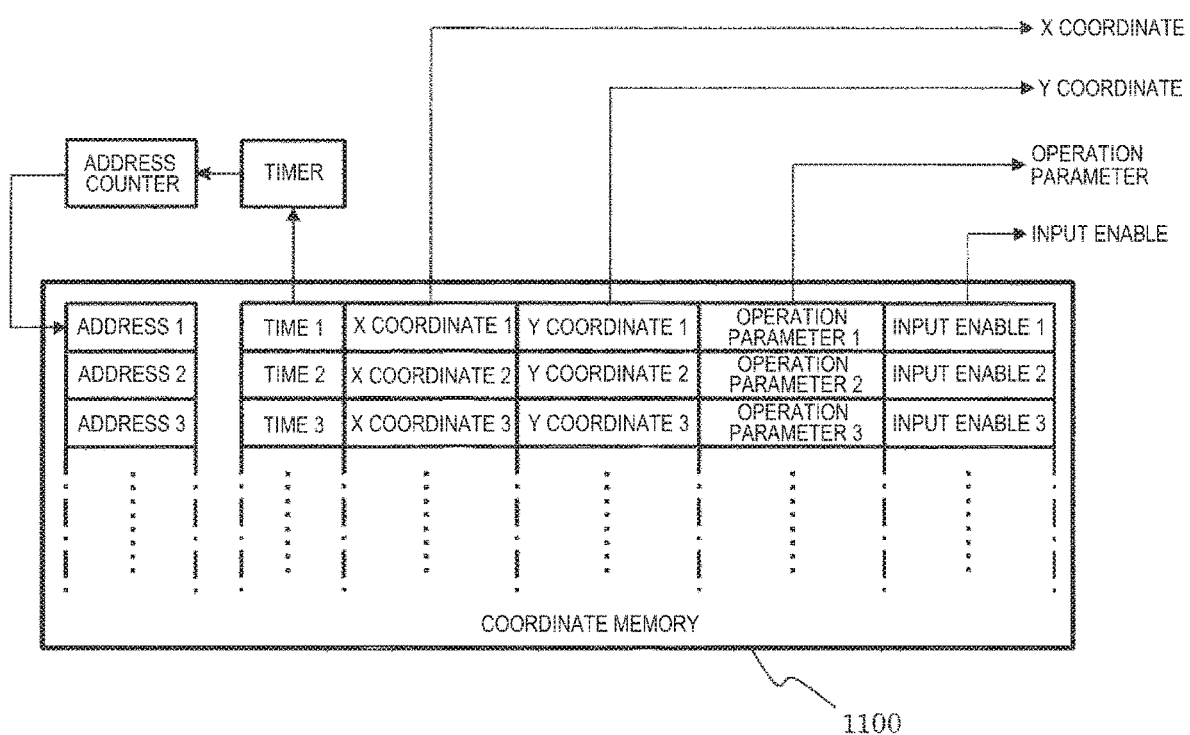

[FIG. 12]
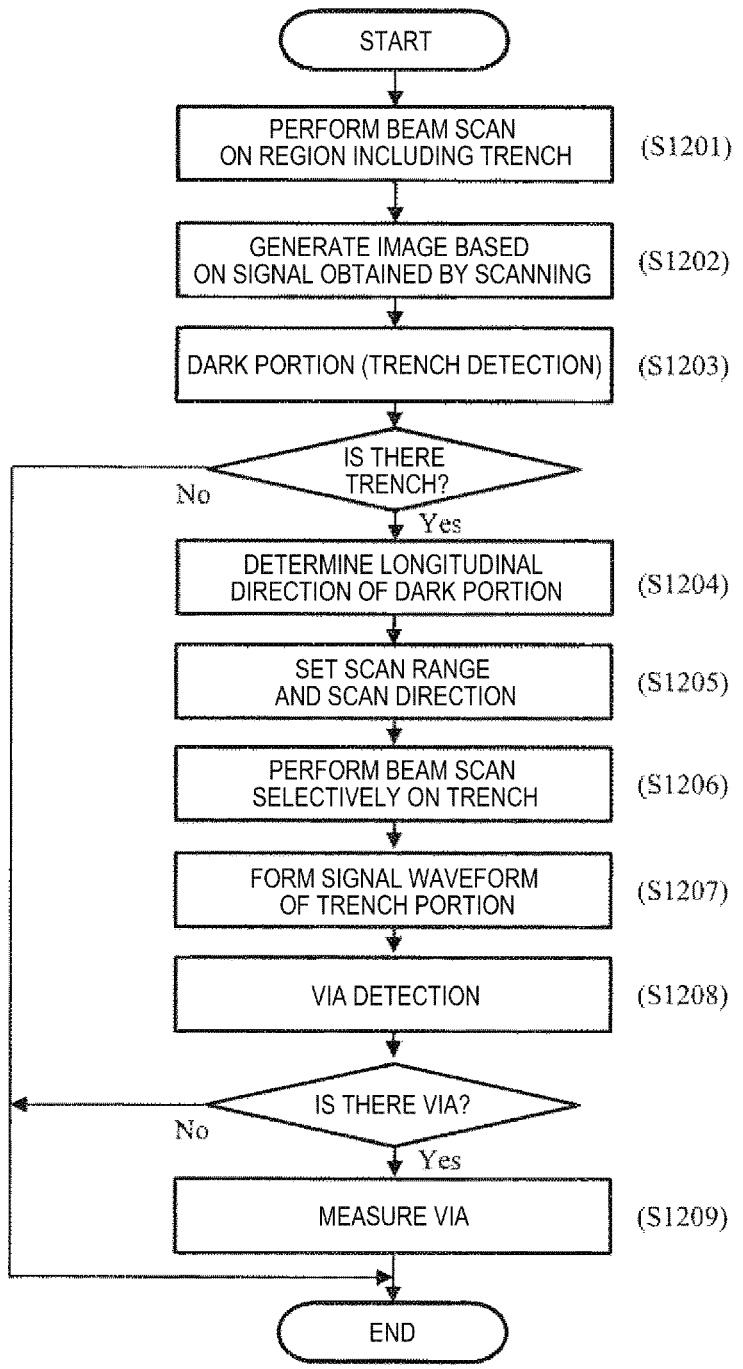

CHARGED PARTICLE BEAM DEVICE FOR IMAGING VIAS INSIDE TRENCHES

TECHNICAL FIELD

The present invention relates to a charged particle beam device, and particularly to a charged particle beam device capable of performing a suitable scan depending on a sample.

BACKGROUND ART

In recent years, semiconductor devices have been highly integrated, and as the number of layers increases, the aspect ratio (depth/width) of vias (hole patterns) for connecting patterns formed on the upper layer and the lower layer tends to increase. Incidentally, a charged particle beam device such as a scanning electron microscope is used to manage the fabricating process of a semiconductor device. The scanning electron microscope (SEM) is a device that acquires an image of a pattern and a signal waveform by scanning a focused electron beam on a fine pattern, and is a device capable of measuring and inspecting fine patterns. However, since electrons emitted from the bottom of a pattern with a large aspect ratio collide with the side wall of the via before being emitted on a surface of a sample, detection efficiency is low, and as a result, it is difficult to measure the bottom of via with high accuracy.

In PTL 1, a scanning electron microscope is disclosed which measures the overlapping degree of a lower layer wiring and a hole. More specifically, a technique is disclosed that when a peak corresponding to an edge cannot be detected in the signal waveform, since it is difficult to extract the edge by a threshold method, the region including the edge position is segmented and a threshold is set in the segment, thereby detecting the edge position. In PTL 2, a beam scanning method is described in which the irradiation amount of the beam is maintained high for the portion desired to improve S/N thereof, and the irradiation amount is lowered in order to alleviate the influence of electrification or the like for other portions.

CITATION LIST

Patent Literature

PTL 1: JP-A-2014-163860
PTL 2: WO2015045498A

SUMMARY OF INVENTION

Technical Problem

While electrons emitted from the surface of the sample can be detected with high accuracy, the detection efficiency of electrons emitted from the bottom of a pattern with a large aspect ratio such as the via bottom is low. As disclosed in PTL 1, if the beam is scanned over a wide region including a via, a delicate contrast of a low luminance region such as the bottom of the via is buried in a high luminance region, so that it is difficult to perform high accuracy measurement of the via bottom and the like. As disclosed in PTL 2, in order to relatively increase the luminance of the low luminance region relative to the high luminance region, it is conceivable to improve the irradiation amount of the low luminance region. However, in the case of a pattern with a large aspect ratio, there is a significant difference in the signal detection efficiency between the sample surface and the via bottom, and it is conceivable that measurement and inspection of the via bottom cannot be performed with high accuracy.

In recent semiconductor devices, Cu wiring having a low electric resistivity has been widely used in order to cope with miniaturization, high integration, and the lower power consumption. The Cu wiring is generally formed by a dual damascene process. The dual damascene process is a process of forming a trench (Trench) in which an upper layer wiring is formed in an insulating film and a via (Via) connecting the upper layer wiring to the lower layer wiring or the substrate, filling with Cu, and planarizing by CMP.

It is desirable to use an electron microscope capable of measuring and inspecting a fine pattern for observation and measurement of such pattern (via in trench) in which a via is formed at the bottom of a trench. However, it is very difficult to find, from the inside of trenches with high aspect, vias with further higher aspect. Further, in semiconductor process management in recent years, there is a high demand for more efficient measurement and inspection, and automation is required.

Hereinafter, a charged particle beam device is proposed to set device conditions for finding a hole or the like provided in a trench or a pit from an image of a trench-like groove or the pit, or to measure a hole or the like provided in the trench or the like with high accuracy.

Solution to Problem

As one aspect for achieving the object, there is proposed a charged particle beam device including:
a deflector for causing a charged particle beam emitted from a charged particle source to perform a scan;
a detector for detecting a charged particle obtained based on the scanning of the charged particle beam; and
a computation processing device for generating an image based on an output of the detector, wherein
the computation processing device specifies, from within the generated image, a relatively dark region with respect to other parts thereof, and controls the deflector such that the charged particle beam selectively scans a sample position corresponding to the dark region.

In addition, as another aspect for achieving the object, there is proposed a charged particle beam device including:
a deflector for causing a charged particle beam emitted from a charged particle source to perform a scan;
a detector for detecting a charged particle obtained based on the scanning of the charged particle beam; and
a computation processing device for generating an image based on an output of the detector, wherein
the computation processing device specifies, from within the generated image, a relatively dark region with respect to other parts thereof, and sets a scanning line direction and a scan region of the deflector which are a sample position corresponding to the dark region so as to make the scanning line direction along a longitudinal direction of the dark region.

Advantageous Effects of Invention

According to the configuration described above, it is possible to set device conditions for finding, from the image of a trench-like groove or a pit, a hole or the like provided in the trench or the pit, or measure a hole or the like provided in the trench or the like with high accuracy.

BRIEF DESCRIPTION OF DRAWINGS

FIGS. 1A and 1B are views illustrating a structure (top view and cross sectional view) of a via in trench.

FIG. 2 is a configuration diagram illustrating a scanning electron microscope system.

FIG. 3 is a flowchart illustrating a device condition setting process for detecting a via pattern.

FIGS. 4A to 4C are views illustrating an outline of a frame number automatic setting process at the time of an electron beam scan for trench recognition.

FIGS. 5A to 5C are views illustrating an outline of a frame number automatic setting process at the time of an electron beam scan for via recognition.

FIG. 6 is a flowchart illustrating a via pattern detecting process.

FIG. 7 is a view illustrating an outline of a trench recognizing process.

FIG. 8 is a view illustrating an outline of a trench region specifying process.

FIG. 9 is a view illustrating a signal waveform example obtained when a scan region is set such that a longitudinal direction of the trench is a scanning line direction.

FIG. 10 is a view illustrating a specific example of the scanning electron microscope system.

FIG. 11 is a view illustrating an outline of a coordinate memory which stores irradiation conditions of a beam in units of pixels.

FIG. 12 is a flowchart illustrating an automatic measuring process including a via searching process.

DESCRIPTION OF EMBODIMENTS

In recent years, as the miniaturization of semiconductor devices, the aspect ratio (depth/width) of trenches (groove-shaped patterns) or vias (hole patterns) tends to increase. As a result, it is difficult to detect the signal of the via edge or the trench bottom. In addition, it is necessary to use double patterning such as SADP (Self Aligned Double Patterning) in formation of fine vias or trenches, thereby being affected by various processes such as film formation or etching. Therefore, it is necessary to manage not only the dimension of vias or trenches but also the positional deviation, the residual film or the like.

In the embodiment described below, an electron beam scan is performed in a direction conforming to patterns, so that a measurement target pattern is pinpointedly captured to facilitate improvement of throughput by shortening the capturing time. Particularly, it is effective for the measurement of a multilayer structure such as a via in trench illustrated in FIG. 1. The via in trench is formed by at least two pattern layers, and the via is positioned in the lower layer of a groove (trench) region between the line patterns of the upper layer (FIG. 1(a), (b)). Compared with the Line/Space pattern of the upper layer, it is difficult to detect the signal of the hole pattern of the lower layer, where escape of electrons onto the sample is restricted. Therefore, the region of the via pattern can be irradiated with the electron beam concentratedly by performing recognition of the trench region which is relatively easy to detect and recognition of the via pattern present in the region in a stepwise manner.

First, an electron beam scan is performed in a direction perpendicular to the trench direction, and recognition of the trench region is executed by using the obtained signal waveform. Since the electron beam scan is performed in the direction perpendicular to the trench direction, that is, a direction perpendicular to the Edge direction of the pattern, it is possible to obtain the signal effectively. In addition, since it is sufficient that the trench region can be recognized in this case, the irradiation amount of electron beams per unit area is sufficient as a recognizable minimum irradiation amount. Next, in order to perform measurement of vias, electron beam irradiation is performed on the recognized trench portion in a parallel direction to the trench direction. Since the signal generation efficiency is poor, it is necessary to increase the electron beam irradiation amount. However, in this case, since the electron beam irradiation is performed concentratedly only on the trench region, it is possible to perform an electron beam scan effectively as compared with the case of performing an electron beam scan on a portion including the peripheral region of the via portion.

According to the method as described above, since it is possible to intensively perform irradiation of the scanning line in a direction of the edge of the measurement target pattern, such that useless electron beam irradiation on a location other than the measurement target is not performed, improvement of throughput of the device can be expected.

FIG. 2 is a configuration diagram illustrating a scanning electron microscope system. The scanning electron microscope system includes an image processing device 1, an external storage medium 2, an electron beam controller 3, a casing 4, and an image generating unit 5. The image processing device 1 is configured as a computer including a CPU (Central Processing Unit), a memory, a hard disk (storage unit), and a network interface. This computer causes the respective processing units to be operated by the CPU executing the read program on the memory. The image processing device 1 is connected with a display serving as a display unit. The external storage medium retains image data and the like. The electron beam controller 3 controls an electron beam according to a scan direction decided in the image processing device 1. The casing 4 includes an electron gun 401, scan coils 403 for controlling an irradiation position of an electron beam 402 emitted from the electron gun, and a secondary electron detector 406 which detects a secondary electron 405 emitted from a sample 404 according to the irradiation position of the electron beam 402. The image generating unit 5 generates information detected in the casing 4 as an image.

FIG. 10 is a view illustrating a specific configuration of a scanning electron microscope system. An electron beam 1003, which is extracted by an extraction electrode 1002 from an electron source 1001 and is accelerated by an acceleration electrode (not illustrated), is focused by a condenser lens 1004 which is one form of a focusing lens, and then is scanned on a sample 1009 one-dimensionally or two-dimensionally by a scan deflector 1005. The electron beam 1003 is decelerated by a negative voltage applied to the electrode built in a sample stage 1008 and is focused by the lens action of an objective lens 1006, whereby the sample 1009 is irradiated thereon with the electron beam.

When the sample 1009 is irradiated with the electron beam 1003, an electron 1010 such as a secondary electron and a backscattered electron is emitted from the irradiation location. The emitted electron 1010 is accelerated in a direction of the electron source according to an acceleration action based on the negative voltage applied to the sample, collides with a conversion electrode 1012, and generates a secondary electron 1011. The secondary electron 1011 emitted from the conversion electrode 1012 is captured by a detector 1013, and the output of the detector 113 varies according to the amount of captured secondary electron. According to the output, the luminance of a display device (not illustrated) changes. For example, when forming a two-dimensional image, an image of the scan region is formed by synchronizing a deflection signal to the scan deflector 1005 and the output of the detector 1013. In addition, the scanning electron microscope illustrated in FIG. 1 includes a deflector (not illustrated) moves a scan region of the electron beam. The deflector is used to form an image and the like of a pattern of the same shape and present at different positions. The deflector is also referred to as an image shift deflector and enables movement of the visual field position of the electron microscope without moving a sample by the sample stage or the like. The image shift deflector and the scan deflector may be used as a common deflector, and a signal for image shifting and a signal for scanning may be superimposed to be supplied to the deflector.

In the example of FIG. 10, although the description that the electron emitted from the sample is converted at one end by the conversion electrode to be detected is made as an example, it is not limited to such a configuration of course. For example, on the trajectory of accelerated electrons, an electron multiplication tube or a detection surface of a detector may be arranged. In addition, a blanking deflector (not illustrated) is installed in the SEM 1000. The blanking deflector is a mechanism for blocking beam irradiation on the sample by deflecting the beam outwards from the beam optical axis, and is controlled according to an operation parameter stored in a coordinate memory to be described.

Incidentally, in the embodiment, an electrostatic deflector is adopted as a scan deflector 1005. Compared to an electromagnetic deflector, the electrostatic deflector enables high-speed scanning. If high-speed scanning is not required, the electromagnetic deflector may be used. A control device 120 controls the respective components of the scanning electron microscope and has a function of forming an image based on the detected electrons and a function of measuring a pattern width of the patterns formed on the sample based on the intensity distribution of detection electrons called as a line profile. In addition, in the control device 1020, an SEM controller 1030 for controlling optical conditions of the SEM and a signal processing unit 1031 (image processing unit) which performs signal processing of detection signals obtained by the detector 1013.

The signal processing unit 1031 includes a pattern dimension measuring unit 1032 which measures the dimension of the pattern based on the generation of the line profile as described above and a pattern determination unit 1033 which determines, based on the waveform of the profile, the presence or absence, the position, and the shape of the pattern. The SEM controller 1030 includes a scan range setting unit 1034 which sets a scan range of an electron beam based on the presence or absence, the position, and the shape of the pattern determined by the pattern determination unit 1034, a scan direction setting unit 1035 which sets a direction of the scanning line within the scan range set by the scan range setting unit 1034, and a deflector controller 1036 which generates a scan signal based on the beam scan conditions set by the scan range setting unit 1034 or the scan direction setting unit 1035.

The deflector controller 1036 executes a beam scan based on information stored in the coordinate memory as illustrated in FIG. 11. In the coordinate memory 1100, per address, time data, X-coordinate data, Y-coordinate data, an operation parameter, and input enable data are stored. In the coordinate memory 1100, the beam scan conditions set by the scan range setting unit 1034 or the scanning line direction setting unit 1035 are written. The data input in the "time" section of the memory indicates an irradiation time, a reaching time, or the like of each address, and is settable in a pixel unit. Also, the operation parameter (ON/OFF of blanking, direction, or the like) of the beam is settable in a pixel unit, and it is possible to control the irradiation time (scan time) in a pixel unit, ON/OFF of blanking, and the like. Each address corresponds to pixels. The time data of the coordinate memory is read out by the timer, and the address counter performs counting up, thereby reading out data from the coordinate memory with one piece of coordinate data as one unit. The update time of the address counter can be changed in units of coordinates. The blanking enable data controls the blanking of the primary electron beam in units of coordinates. In addition, the input enable data controls writing on the image memory included in the signal processing device.

The image memory is, for example, a memory capable of storing 256 gradations in the depth direction with 1024× 1024 pixels. Based on the signal output from the SEM control device, writing of a signal is executed to each address (pixel). The address signal corresponding to the memory position of the image memory is synchronized to the beam irradiation position, thereby matching the beam irradiation position with the writing coordinates. The signal read out corresponding to the address is converted from digital to analog by the D-A converter to be the luminance modulation input of the image display device. In the signal processing unit 1031, an integration process of integrating image data obtained based on a plurality of times of scans is performed. The integration process is performed by adding and averaging signals obtained with a plurality of frames per pixel. The control device 1020 executes processing as described below based on the information input to the coordinate memory 1100.

In the pattern measuring process, recognition of a measurement position is automatically performed on the basis of foresight information registered in advance, the measurement pattern registration process and the automatic recognizing process at the time of pattern measurement will be described.

The scan direction setting unit 1035 sets the scanning line direction for performing one-dimensional or two-dimensional scan. For example, when a two-dimensional scan is performed, the beam is scanned in one direction (for example, the X direction), and the beam scanning position is sequentially moved in another direction (for example, the Y direction), thereby performing the two-dimensional scanning.

First, measurement a pattern registration process in pattern measurement in a via in trench will be described. The processing flow is illustrated in FIG. 3. First, in order to specify the trench direction, electron beam irradiation is performed on a predetermined region including a trench, and a trench region and a trench direction are specified from the obtained signal waveform (S302). Initial beam scan conditions execute scanning according to a recipe which is a pre-registered operation program. The pattern determination unit 1033 binarizes an image, for example, and performs blob detection in a high luminance region and a low luminance region. Further, the pattern determination unit 1033 specifies the longitudinal direction of the low luminance region, and stores the specified direction in a predetermined storage medium as determination information for setting the scanning line direction, which will be described later. Further, binarization of the signal is performed in the trench direction (longitudinal direction of the trench), blob detection in the region of high luminance or low luminance side is performed, a direction in which the blob length is long can be recognized as a trench direction, and it is also possible to set a direction in which the strongest peak appears when the signal is converted into a frequency as the trench direction. In addition, when the trench direction is known in advance, this process can be omitted.

Next, information necessary for trench recognition is registered. First, the scan range setting unit 1034 sets a region (capturing magnification) to be irradiated with an electron beam by trench detection (S303). In recognition of the trench, the electron beam scan is performed in a direction perpendicular to the trench direction, but in this case, since the recognition is performed with respect only to the trench, it is possible to set the electron beam irradiation amount per unit area to a minimum irradiation amount by which the trench position can be specified, thereby performing an automatic setting of the electron beam irradiation amount in this processing (S304). In capturing an SEM image, although the electron beam scan is performed on the same region a plurality of times and the signals are added to improve the S/N ratio, the electron beam irradiation amount in this case is the number of times (number of frames) to scan the same region. For recognizing the trenches, a method of template matching performed by using previously registered image data, or a method of specifying a dark part by binarizing the captured image. Here, a frame number automatic setting process for specifying the dark part by binarization will be described (FIG. 4).

First, the frame is incremented by one frame to perform an electron beam scan (FIG. 4(a)), and a histogram of the signal intensity of the signal added in each frame is calculated (FIG. 4(b)). Since the intensity distribution of the histogram is divided into two at the line/trench portion, the distance between the two peaks (separation degree) is calculated. If the number of frames increases, since the S/N ratio of the signal stabilizes and the separation degree also stabilizes, a frame in which a change in the separation degree is less than a predetermined amount is set as the number of frames for trench detection (FIG. 4(c)). In addition, when the number of frames is set manually, the present process can be omitted. Regarding the width of the trench, it is possible to set the width at the time of registration, but it is also possible to automatically detect in the actual pattern measuring process. The automatic detection process will be described in the following embodiments.

Next, necessary information for performing the recognition of the via is registered. The necessary information is the scan range of the via region (information on a region to be irradiated with the beam), the scan direction, and the number of frames of electron beam scanning (S305 and S306). Parameters and algorithms necessary for the measurement of vias can also be registered through this process, but the process of registering the number of frames will be described here. Since the via portion exists in the lower layer of the line portion, and the signal due to the electron beam irradiation is hardly emitted, it is necessary to perform the electron beam irradiation sufficiently in order to obtain the S/N ratio necessary for the measurement. Therefore, in order to set the number of frames to the number by which a sufficient S/N ratio can be obtained, electron beam irradiation is performed a plurality of times on the via portion as the measurement target (FIG. 5(a)), and the difference between the maximum value and the minimum value of the signal in each added frame (FIG. 5(b)). If the difference between the maximum value and the minimum value is within a predetermined threshold value as compared with the previous frame number, the number of frames is registered as the number of frames for via capturing (FIG. 5(c)).

The pattern detection process and the pattern measuring process in the via in trench will be described with reference to the flowchart illustrated in FIG. 6. Before starting the process, it is necessary to move the stage or the like to a position where a via can be measured so that the via falls within the electron beam scan region. First, in order to specify the trench portion in the upper layer, the electron beam scan direction (direction perpendicular to the trench direction), the magnification, and the number of frames set at the time of registration are set and the electron beam scan is performed (S602). The pattern determination unit 1033 specifies the trench portion by using the signal waveform obtained by scanning the electron beam (S603). The specification of the trench portion can be performed by binarizing the obtained signal waveform by Otsu's binarization or by a preset threshold value or the like. More specifically, as illustrated in FIG. 7, a bright part which is a line portion and a dark part which is a trench portion are identified by using a profile waveform obtained when an electron beam is scanned. In the example of FIG. 7, a portion brighter than a predetermined threshold is identified as a line portion, and a portion darker than a predetermined threshold is identified as a trench.

Next, in the scan range setting unit 1034, an electron beam irradiation width (trench width) at the time of via measurement is calculated. As illustrated in FIG. 8, the scan range setting unit 1034 specifies only the dark part such that the bright parts are not included in the scan range during capturing vias. From the specification, a region is detected in which the luminance is equal to or less than the luminance calculated from the maximum value and the minimum value of the signal waveform, and the predetermined threshold value. The predetermined threshold value may be set in the program or may be set as an external parameter. By selectively setting only the dark part as the scan range, since a bright part (a part where more electrons can be detected) on the surface of the sample can be excluded from the signal waveform formation range, it is possible to relatively enhance the contrast of the via edge in the trench.

Further, in the scan direction setting unit 1035, scan conditions are set so that the line direction of the scanning line is the longitudinal direction of the trench. In the trench illustrated in FIG. 9, since the longitudinal direction of the trench is in the lateral direction (x direction) of the paper surface, the scanning line direction is set so that the scanning line (scanning trajectory) is along the x direction. In this way, by setting the scanning line along the longitudinal direction of the trench (ideally parallel to the edge of the trench), it is possible to emphasize the edge of the via provided in the trench. Also, the moving direction of the scanning line position is set in the y direction. Since the edges in the longitudinal direction (y direction) of the paper surface of vias, which are formed in the trenches, are almost overlapped with edges of the trench, it is difficult to detect the vias, and when considered the assumption that the scan range is selectively set in the trenches, it is difficult to include the edge in the y direction of the via in the scan range. In the embodiment, a scan range is set selectively in the trench, and the scan conditions are set so that the scanning line direction extends along the longitudinal direction of the trench so as to ensure that the edges of the vias are within the scan range.

Subsequently, vias are detected by scanning electron beams in the regions calculated by the scan range setting unit 1034 and the scan direction setting unit 1035. The length of scanning the electron beam (the length of the scanning line) is set to the width set at the time of registration and the scanning width (the size of the scanning range in the direction orthogonal to the scanning line direction) is obtained by the scan range setting unit 1034, and the number of frames is set with the number of frames at the time of registration. The scan direction is set so that the scanning line direction extends along the longitudinal direction of the dark part specified by the pattern determination unit 1033. In this way, the electron beam scan is performed so that the electron beam trajectory is drawn horizontally in the longitudinal direction of the trench with respect to the trench region (S604).

Next, since it is not limited that the via is necessarily present in the trench region, determination whether the via exists or not is performed (S605). If the value obtained by subtracting the maximum value and the minimum value of the signal of the scan region is equal to or more than the predetermined threshold value, the region can be determined that the via is present. In the example of FIG. 9, since there is a difference between the maximum value and the minimum value equal to or more than the predetermined value in the signal acquired in the scan region (2), the pattern determination unit 1033 determines that a via is present in the scan region (2).

Finally, the pattern dimension measuring unit 1032 calculates the width of the via using a predetermined algorithm and measurement parameter for the region determined to be a via (S606). The pattern determination unit 1033 repeats this process by extent of the trench determined that there exists a via (S607).

As described above, a scan is performed by dividing the electron beam scan direction with respect to the direction of pattern, and thus it is possible to perform an electron beam scan effectively on only the measurement target portion, thereby improving throughput of the device.

FIG. 12 is a flow chart illustrating an automatic measuring process using an electron microscope. The automatic measuring process illustrated in FIG. 12 includes a process of automatically searching a via in trench and executing measurement. First, the deflector controller 1036 of the scanning electron microscope illustrated in FIG. 10, executes a beam scan by positioning the field of view in the region including the trench based on the scan condition determined in advance (Step 1201). By setting the movement condition of the sample stage or the deflection condition of the deflector for visual field movement as the capturing recipe in advance, the visual field is automatically aligned, thereby performing a beam scan. Next, an image is generated based on signals such as secondary electrons and backscattered electrons obtained by scanning (Step 1202). After that, the pattern determination unit 1033 specifies a trench portion based on the method as illustrated in FIGS. 7 and 8 from the obtained image (Step 1203). Since the luminance is determined based on the detection of electrons emitted from the groove bottom, compared to the upper portion of the line pattern, the trench has lower luminance, and by using the difference in luminance, the trench portion is identified from other parts thereof. If the dark part is not present in the image formed in Step 1202, it is considered that there is no via in trench as a measurement target, thereby ending the measurement. For specifying the trench, for example, if there is a set of pixels (a set of pixels of a predetermined number or more) in which the luminance is a predetermined value or less, the corresponding portion may be determined as the trench, or the shape information of the trench is stored in advance, and based on the comparison between the shape information and the shape of the dark part, if the shape state index between the shape information and the dark part is a predetermined value or more, it may be determined that the trench exists. Further, when the dark part extends long in a specific direction, the long dark region may be specified as a trench.

Next, the pattern determination unit 1033 determines the longitudinal direction of the trench (Step 1204). In determination of the longitudinal direction of the trench, for example, it is considered processes that the center of the dark region is obtained, the length of a plurality of directions is obtained with reference to the center, the longest direction among the plurality of directions is set to the longitudinal direction of the trench, and the like. In addition, the edge of the dark region may be extracted, thereby determining the edge direction with the longest length of linear approximation as the longitudinal direction.

Next, the scan range setting unit 1034 selectively sets the inside of the trench as a scan region, and the scan direction setting unit 1035 sets the scanning line direction (main scan direction) as the length of the trench and sets the moving direction (sub scan direction) of the scanning line a direction orthogonal to the longitudinal direction of the trench (Step 1205). Since it is necessary to set the length of the scan region in the scanning line direction to include the region considered to include the via, it is desired to set the scan range which is sufficiently longer than the via diameter in consideration of the positional deviation and the like. Further, the length of the scan region in the direction orthogonal to the scanning line is set so that the surface of the sample is not overlapped with the scan range. Further, the scan region may be set to be narrower than the trench region in a range not lowering the measurement accuracy such that the surface of the sample is not overlapped with the scan range.

Next, the deflector controller 1036 supplies a signal for beam scanning to the scan deflector 1005 based on the scan conditions set by the scan range setting unit 1034 and the scan direction setting unit 1035 and selectively performs a beam scan (Step 1206). When there are a plurality of trenches, the scanning of Step 1206 is repeated for the set trenches. Using the signal waveform obtained by such scanning, the pattern determination unit 1033 detects vias (Steps 1207 and 1208). Since presence or absence of vias can be determined by signal detection in each scan region as illustrated in FIG. 9, the pattern dimension measuring unit 1032 executes measurement in the scan region where vias exist (Step 1209). If the via is not present, and the measuring process is ended without performing measurement. However, when a via does not exist at a position where a via should be located on the design data, since it is conceivable that a failure of a semiconductor device or a fact that an image of the electron microscope is not properly formed, the error information may be output from the pattern determination unit 1033.

When it cannot be determined whether the via cannot be detected due to a failure of the semiconductor device or the via cannot be detected since the via is not present in the trench originally, the pattern determination unit 1033 can identify the vias be referring to the arrangement information of the vias. For example, when it is clear from the design data that the vias are arranged in alternate trenches, the detection result of vias (arrangement state of vias) is compared with the design data. When the detection result of the vias matches with the arrangement state of the design data, it is determined that the semiconductor device is properly formed or the measurement result is appropriate. When the both do not match with each other, since there is a possibility that a failure of the semiconductor device or that the pattern detection was not performed appropriately, the content thereof may be output as a detection result. With such a configuration, it is easy to investigate the cause when measurement was not properly performed.

REFERENCE SIGNS LIST

1: image processing device
2: external storage medium
3: electron beam controller
4: casing
5: image generating unit
401: electron gun
402: electron beam
403: scan coil
404: sample
405: secondary electron
406: secondary electron detector

The invention claimed is:

1. A charged particle beam device comprising:
a deflector for causing a charged particle beam emitted from a charged particle source to perform a scan;
a detector for detecting a charged particle obtained based on the scanning of the charged particle beam; and
a computation processing device for generating an image based on an output of the detector, wherein
the computation processing device specifies, from within an image obtained by controlling the deflector such that a scan path of a first direction intersects an edge of a pattern formed on a sample, a relatively dark region with respect to other parts thereof, and controls the deflector such that a scan path is selectively set at a position of the sample corresponding to the dark region, and along a second direction as a longitudinal direction of the dark region, to specify a part in the dark region having a luminance different from luminances in other regions in the dark region, the second direction being selected such that the other parts are not in the scan path.

2. The charged particle beam device according to claim 1, wherein
the computation processing device sets a scan direction of the charged particle beam such that a scanning line direction of the charged particle beam is made along the longitudinal direction of the dark region.

3. The charged particle beam device according to claim 1, wherein
the computation processing device performs dimension measurement of a pattern included in the dark region based on a signal obtained by selectively scanning the pattern included in the dark region.

4. The charged particle beam device according to claim 1, wherein
the computation processing device determines whether to perform pattern dimension measurement included in the dark region based on a signal obtained by selectively scanning the pattern included in the dark region.

5. The charged particle beam device according to claim 1, wherein
the dark region is a trench including a via thereinside.

6. A charged particle beam device comprising:
a deflector for causing a charged particle beam emitted from a charged particle source to perform a scan;
a detector for detecting a charged particle obtained based on the scanning of the charged particle beam; and
a computation processing device for generating an image based on an output of the detector, wherein
the computation processing device specifies, from within an image obtained by controlling the deflector such that a scan path of a first direction intersects an edge of a pattern formed on a sample, a relatively dark region with respect to other parts thereof, and sets a scanning line direction and a scan region of the deflector such that a scan path is selectively set at a position of the sample corresponding to the dark region, and along a second direction as a longitudinal direction of the dark region, to specify a part in the dark region having a luminance different from luminances in other regions in the dark region so as to make the scanning line direction along a longitudinal direction of the dark region, the second direction being selected such that the other parts are not in the scan path.

7. The charged particle beam device according to claim 6, wherein
the computation processing device sets a scan region such that a region of scanning with respect to the longitudinal direction of the dark region is included in the sample position corresponding to the dark region.

8. The charged particle beam device according to claim 6, wherein
the computation processing specifies a longitudinal direction of a trench formed on the sample based on the specification of the dark region and sets scan conditions such that the scanning line direction is parallel to the longitudinal direction.

* * * * *